(12) United States Patent
Ishikawa et al.

(10) Patent No.: US 9,459,327 B2
(45) Date of Patent: Oct. 4, 2016

(54) VOLTAGE MEASUREMENT DEVICE FOR BATTERY ASSEMBLY

(75) Inventors: Satoshi Ishikawa, Makinohara (JP); Tsutomu Saigo, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 919 days.

(21) Appl. No.: 13/639,545

(22) PCT Filed: Apr. 20, 2011

(86) PCT No.: PCT/JP2011/059756
§ 371 (c)(1),
(2), (4) Date: Oct. 5, 2012

(87) PCT Pub. No.: WO2011/136110
PCT Pub. Date: Nov. 3, 2011

(65) Prior Publication Data
US 2013/0022844 A1 Jan. 24, 2013

(30) Foreign Application Priority Data
Apr. 28, 2010 (JP) ................. 2010-103867

(51) Int. Cl.
*G01N 27/27* (2006.01)
*G01R 31/36* (2006.01)
(Continued)

(52) U.S. Cl.
CPC ........ *G01R 31/3658* (2013.01); *H01M 10/441* (2013.01); *H01M 10/482* (2013.01); *B60L 2240/547* (2013.01); *G01R 31/362* (2013.01); *H01M 2010/4271* (2013.01)

(58) Field of Classification Search
CPC ...................................................... H02J 7/007
See application file for complete search history.

(56) References Cited

U.S. PATENT DOCUMENTS 5,504,415 A * 4/1996 Podrazhansky ....... H02J 7/0016
320/118
8,330,469 B2 * 12/2012 Miyamoto ............. G01R 15/04
320/116

(Continued)

FOREIGN PATENT DOCUMENTS

JP 8146050 A 6/1996
JP 2002-139522 A 5/2002

(Continued)

OTHER PUBLICATIONS

Office Action issued Sep. 30, 2014; by the Japanese Patent Office in related Application No. 2010-103867.

(Continued)

*Primary Examiner* — Drew A Dunn
*Assistant Examiner* — Steve T Chung
(74) *Attorney, Agent, or Firm* — Sughrue Mion, PLLC

(57) ABSTRACT

A voltage measurement device for measuring an output voltage of a battery assembly includes voltage addition sections that add a predetermined voltage value to output voltages of the cells, voltage detection sections that detect addition voltages which are output voltages of the voltage addition sections corresponding to the cells of the individual blocks, A/D converting sections that digitize analog voltage signals of the addition voltages detected by the voltage detection sections, and a control section that outputs voltage measurement request signals to the voltage detection sections respectively, and that acquires the addition voltages, subtracts the predetermined voltage value from the acquired addition voltages and provides voltage values after the subtractions, as the output voltages of the cells.

4 Claims, 5 Drawing Sheets

(51) Int. Cl.
H01M 10/44 (2006.01)
H01M 10/48 (2006.01)
H01M 10/42 (2006.01)

(56) References Cited

U.S. PATENT DOCUMENTS

| | | |
|---|---|---|
| 2002/0075004 A1 | 6/2002 | Yudahira et al. |
| 2006/0077603 A1* | 4/2006 | Kim .................. H02H 7/18 361/90 |
| 2006/0132099 A1* | 6/2006 | Aradachi ............ H02J 7/0091 320/150 |
| 2006/0132139 A1 | 6/2006 | Ohta et al. |
| 2006/0273802 A1 | 12/2006 | Murakami et al. |
| 2007/0290655 A1* | 12/2007 | Nate .................. H02J 7/0052 320/163 |
| 2008/0219337 A1 | 9/2008 | Kawata et al. |
| 2009/0085516 A1* | 4/2009 | Emori ................ B60L 3/0046 320/118 |
| 2009/0164154 A1 | 6/2009 | Ishikawa et al. |
| 2011/0187326 A1 | 8/2011 | Kawata et al. |
| 2012/0025769 A1* | 2/2012 | Kikuchi ............. B60L 3/0046 320/118 |

FOREIGN PATENT DOCUMENTS

| | | |
|---|---|---|
| JP | 2003243044 A | 8/2003 |
| JP | 200562028 A | 3/2005 |
| JP | 2006153780 A | 6/2006 |
| JP | 200710316 A | 1/2007 |
| JP | 2008220074 A | 9/2008 |
| JP | 2009-156633 A | 7/2009 |
| JP | 2009250615 A | 10/2009 |

OTHER PUBLICATIONS

Office Action dated Jan. 20, 2015 issued by the State Intellectual Property Office of the People's Republic of China in counterpart Chinese Patent Application No. 201180011626.7.
Office Action dated Jan. 21, 2014 issued by the Japanese Patent Office in counterpart Japanese Patent Application No. 2010-103867.
International Search Report dated Aug. 2, 2011 from the International Searching Authority in counterpart international application No. PCT/JP2011/059756.
Written Opinion dated Aug. 2, 2011 from the International Searching Authority in counterpart international application No. PCT/JP2011/059756.
Office Action dated Aug. 12, 2014 issued by the Chinese Intellectual Property Office of P.R. China in corresponding Application No. 201180011626.7.
Office Action dated Dec. 16, 2014, issued by the Japanese Intellectual Property Office in counterpart Japanese Application No. 2010-103867.
Communication dated Feb. 2, 2016 issued by The State Intellectual Property Office of the People's Republic of China in counterpart Chinese Patent Application No. 201180011626.7.
Communication issued on Aug. 5, 2015 by The State Intellectual Property Office of the PR of China in related Application No. 201180011626.7.

* cited by examiner

VOLTAGE MEASUREMENT DEVICE FOR BATTERY ASSEMBLY

TECHNICAL FIELD

The present invention relates to a voltage measurement device for detecting the voltage of a battery assembly in which a plurality of cells are connected in series and which outputs the desired voltage.

BACKGROUND ART

In, for example, an electric vehicle or a hybrid vehicle, a high-voltage battery is included as the drive power source of a motor. With such a high-voltage battery, a high voltage is obtained by connecting the plurality of cells of secondary cells (accumulators), for example, nickel-hydrogen cells or lithium cells in series.

Besides, all the secondary cells are charged or discharged by the same power. Therefore, in a case where the deteriorated states of the individual secondary cells are different, the secondary cells are liable to fall into overcharged states or overdischarged states. In this regard, the charged state of every unit cell needs to be confirmed lest the secondary cells should fall into the overcharged states or overdischarged states. For this purpose, a plurality of (for example, fifty-five) unit cells are divided into, for example, five blocks (namely, in order that one block may consist of eleven cells), and the voltage of each block is measured in real time by a voltage detecting IC which is disposed every block.

On this occasion, in the voltage detecting IC, the voltage of the unit cells (for example, eleven cells) of one block is measured. Further, a detected analog voltage signal is converted into a digital signal by an A/D converter which the voltage detecting IC includes, so as to transmit the digital signal to a main microcomputer. Thereafter, the abnormality of the secondary cells is decided by the main microcomputer, depending upon whether or not the value of the measured voltage lies within a predetermined range (refer to, for example, Patent Document 1).

PRIOR ART DOCUMENT

Patent Document

Patent Document 1: JP-A-2005-62028

SUMMARY OF THE INVENTION

Problems that the Invention is to Solve

With the prior art voltage measurement device stated above, however, the A/D converter can detect only a positive voltage in a case where the positive voltage and a negative voltage coexist in the output voltage of the battery. Therefore, the voltage detecting IC detects the output voltage of the negative voltage as "0" V and then transmits the signal to the main microcomputer, so that the output voltage cannot be accurately measured.

Especially in a case where the prior art voltage measurement device is applied to a fuel battery car in which a vehicle is caused to travel by generating power with hydrogen and oxygen as fuels, the output voltage of a fuel battery sometimes becomes a negative voltage, depending upon the states of the fuels within cells disposed in the fuel battery. Since, on this occasion, the A/D converter is incapable of the A/D conversion of the negative voltage, it detects the output voltage of the cells as "0" V. This has resulted in the problem that the output voltage cannot be accurately measured.

Therefore, the present invention has been made in order to solve such problems of the prior art, and it has for its object to provide a voltage measurement device for a battery assembly as is capable of measuring at high precision an output voltage in which a positive voltage and a negative voltage coexist.

Means for Solving the Problems

In order to accomplish the above object, as the first invention, there is provided voltage measurement device for measuring an output voltage of a battery assembly in which a plurality of cells are connected in series so as to output a desired voltage, the voltage measurement device comprising: voltage addition sections that are respectively provided for the plurality of cells, and that add a predetermined voltage value to output voltages of the cells; voltage detection sections that are provided for respective blocks, and that detect addition voltages which are output voltages of the voltage addition sections corresponding to the cells of the individual blocks wherein the cells are sectioned into the blocks each being constituted by at least one cell; A/D converting sections that are provided for the individual voltage detection sections, and that digitize analog voltage signals of the addition voltages detected by the voltage detection sections; and a control section that is connected through communication lines among the voltage detection sections respectively and outputs voltage measurement request signals to the voltage detection sections respectively, and that acquires the addition voltages detected by the voltage detection sections respectively, subtracts the predetermined voltage value from the acquired addition voltages and provides voltage values after the subtractions, as the output voltages of the cells.

As the second invention, there is also provided the voltage measurement device for a battery assembly according to the first invention, characterized in that each of the voltage detection sections obtains a total voltage of the addition voltages outputted from the voltage addition sections provided for each of the blocks, and the control section subtracts from the total voltage, a value obtained by multiplying the predetermined voltage value by the number of the cells disposed in each of the blocks.

As the third invention, there is also provided the voltage measurement device for a battery assembly according to the first invention or the second invention, further including a voltage converting section that is connected to a power source which supplies power for actuating the control section and that converts the power from the power source, wherein the control section outputs a power supplying signal for supplying power to the voltage converting section in case of outputting the voltage measurement request signals to the voltage detection sections respectively, and the voltage converting section supplies power to the voltage addition sections when the voltage converting section acquires the voltage measurement request signal from the control section.

As the fourth invention, there is also provided the voltage measurement device for a battery assembly as defined in any one of the first invention to the third invention, the N cells of the first cell to the Nth cell are disposed as the cells, a negative electrode of the first cell is grounded, a positive electrode of the Nth cell is set at the highest voltage, and a voltage of the nth cell (where 2≤n≤N) is measured based on a voltage of the (n−1)th cell as a reference voltage.

Advantageous of the Invention

According to the first invention, the predetermined voltage value is added to the output voltage of the cell, whereby the output voltage being a negative voltage is made the output voltage being a positive voltage and is then outputted to the A/D converter, so that the output voltage being the negative voltage is not measured as "0" V.

Besides, the predetermined voltage value added is subtracted from the acquired addition voltage, and the voltage value after the subtraction is provided as the output voltage of the cell, so that the output voltage can be accurately measured.

It is accordingly permitted to provide a voltage measurement device for a battery assembly as is capable of measuring at high precision the output voltage in which the positive voltage and the negative voltage coexist.

According to the second invention, the value which is obtained in such a way that the predetermined voltage value is multiplied by the number of the cells disposed in each block is subtracted from the total voltage of the addition voltages outputted by the voltage addition sections, so that the output voltage of each block can be accurately measured.

Besides, since the predetermined voltage value is added by the voltage addition sections corresponding to the cells of each block, the configurations of the voltage detection sections need not be made different, and the output voltage in which the positive voltage and the negative voltage coexist can be measured with a manufacturing cost reduced.

According to the third invention, the power is supplied to the voltage addition sections by the voltage converting section which is connected to the power source that supplies the power for actuating the control section, so that the power source need not be separately provided, and a manufacturing cost can be reduced.

According to the fourth invention, the voltage of the nth cell is measured with the reference voltage being the voltage of the (n−1)th cell, so that the cell voltage is infallibly measured with the reference voltage being the addition voltage of the positive voltage, whereby the error of the measurement value can be lessened.

MODE FOR CARRYING OUT THE INVENTION

Figure 1:
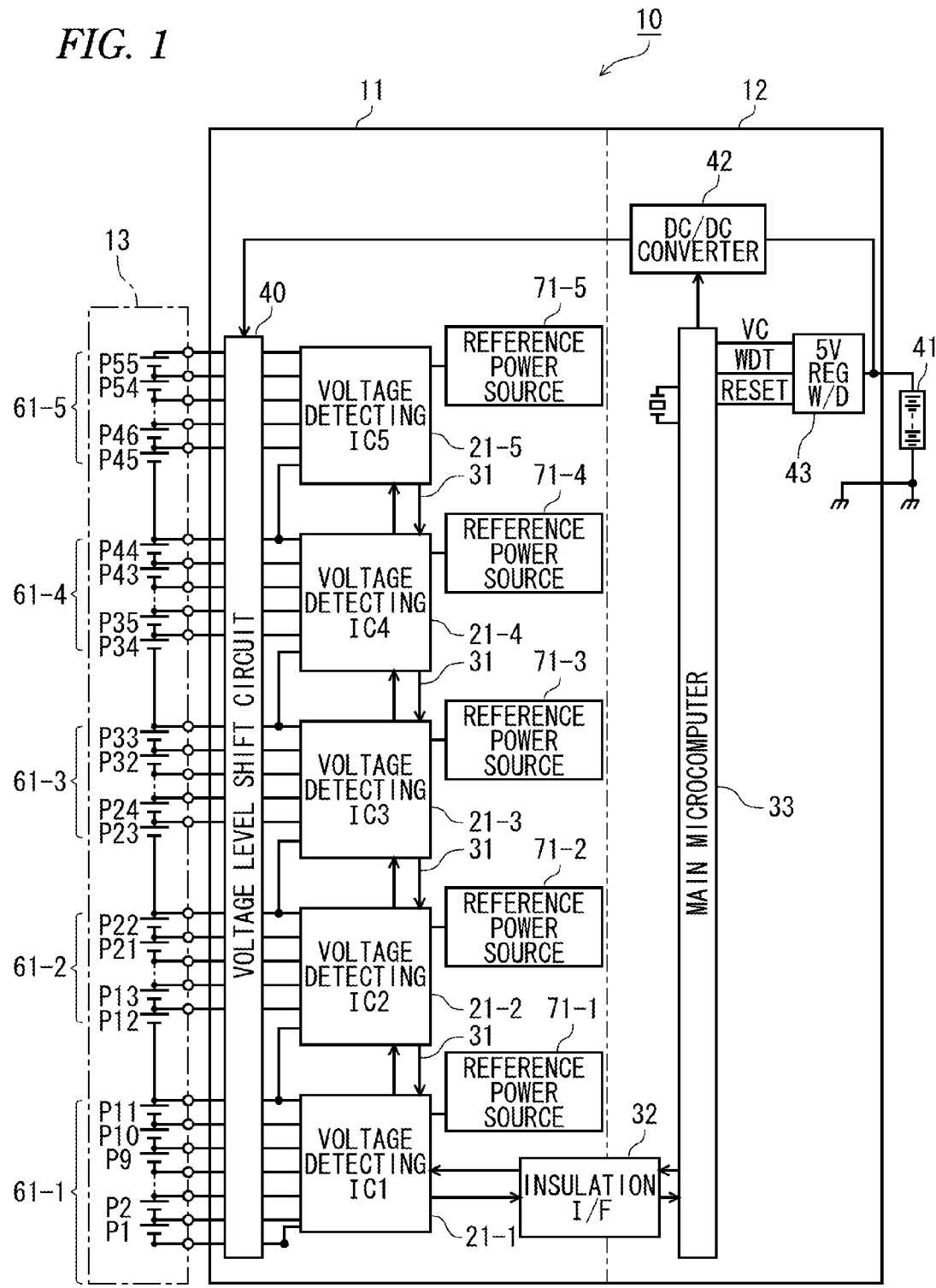
FIG. 1 is a block diagram showing the configuration of a voltage measurement device for a fuel battery according to an embodiment of the present invention.

Now, an embodiment of the present invention will be described with reference to the drawings. First, a voltage measurement device according to the embodiment of the present invention will be described with reference to FIG. 1. FIG. 1 is a block diagram showing the voltage measurement device 10 for a fuel battery according to the embodiment of the present invention, and the fuel battery 13 which consists of a plurality of cells P1-P55. The fuel battery 13 according to this embodiment is used for, for example, an application in which it is mounted on a vehicle so as to supply power for driving a vehicle driving motor.

As shown in FIG. 1, the voltage measurement device 10 according to the embodiment of the present invention measures the output voltage of the fuel battery from which the voltage is outputted by connecting the plurality of cells P1-P55 in series.

The fifty-five cells of the first cell to the fifty-fifth cell are disposed as the plurality of cells P1-P55, in which the negative electrode of the cell P1 (first cell) is grounded, and the positive electrode of the cell P55 (fifty-fifth cell) becomes the highest voltage. Besides, the plurality of cells P1-P55 are respectively provided with voltage level shift circuits (voltage addition sections) 40.

The voltage level shift circuits 40 add predetermined voltage values to the output voltages of the plurality of cells P1-P55. In a case, for example, where a negative voltage which can be outputted from the plurality of cells P1-P55 is −2.5V, the predetermined voltage value is set at 2.5V and is added.

Besides, as shown in FIG. 1, the voltage measurement device 10 according to the embodiment of the present invention is isolated into a high-voltage-side device 11 and a low-voltage-side device 12 through an insulation interface 32.

The high-voltage-side device 11 includes five voltage detecting ICs (voltage detection sections), that is, the first voltage detecting IC (21-1) to the fifth voltage detecting IC (21-5). In addition, the first voltage detecting IC (21-1) measures the addition voltage being the output voltage of the voltage level shift circuit 40 which corresponds to the eleven cells P1-P11 sectioned as the first block (61-1).

Besides, the second voltage detecting IC (21-2) measures the addition voltage being the output voltage of the voltage level shift circuit 40 which corresponds to the eleven cells P12-P22 sectioned as the second block (61-2). Likewise, the third voltage detecting IC (21-3) measures the addition voltage being the output voltage of the voltage level shift circuit 40 which corresponds to the eleven cells P23-P33 sectioned as the third block (61-3), the fourth voltage detecting IC (21-4) measures the addition voltage being the output voltage of the voltage level shift circuit 40 which corresponds to the eleven cells P34-P44 sectioned as the fourth block (61-4), and the fifth voltage detecting IC (21-5) measures the addition voltage being the output voltage of the voltage level shift circuit 40 which corresponds to the eleven cells P45-P55 sectioned as the fifth block (61-5).

Further, each of the individual voltage detecting ICs (21-1)-(21-5) includes an A/D converter 26 (refer to FIG. 4 to be explained later, and indicated as "ADC"). Using a reference voltage which is outputted from the corresponding one of reference power sources 71-1-71-5 for A/D conversions (refer to FIG. 1), the A/D converter 26 converts the analog voltage signal of the addition voltage measured every block (for each of the first block—the fifth block) (the voltage signal obtained by connecting the eleven cells in series), into a digital voltage signal.

That is, the predetermined voltage values are added to the output voltages of the plurality of cells P1-P55 by the voltage level shift circuits 40. Therefore, an analog voltage signal of positive voltage is infallibly inputted as the analog voltage signal which is inputted to the ND converter 26.

Besides, the second-fifth voltage detecting ICs (21-2)-(21-5) are connected with the first voltage detecting IC (21-1) through communication lines 31, and this first voltage detecting IC (21-1) is connected to a main microcomputer (control section) 33 disposed on the side of the low-voltage-side device 12, through the insulation interface (communication line) 32. That is, the main microcomputer 33 and the individual voltage detecting ICs (21-1)-(21-5) are connected by daisy-chain communications through the insulation interface 32.

Besides, the low-voltage-side device 12 is provided with a regulator 43 which outputs a DC voltage of 5V. This regulator 43 generates a DC voltage of stable 5V from a voltage (of, for example, 12V) which is outputted from a battery (power source) 41 mounted on the vehicle, and it supplies the generated DC voltage to the main microcomputer 33.

Further, the battery 41 is connected to a DC/DC converter (voltage converting section) 42, and this DC/DC converter 42 boosts the voltage (of, for example, 12V) outputted from the battery 41, so as to supply power to the voltage level shift circuit 40.

In the voltage measurement device 10 according to the embodiment of the present invention, the main microcomputer 33 outputs a signal for supplying power to the DC/DC converter 42, in case of outputting a voltage measurement request signal to each of the voltage detecting ICs (21-1)-(21-5). When the DC/DC converter 42 acquires the voltage measurement request signal from the main microcomputer 33, it supplies the power to the voltage level shift circuit 40.

In addition, the main microcomputer 33 outputs the voltage measurement request signal to each of the voltage detecting ICs (21-1)-(21-5), and it subtracts the predetermined voltage value from the addition voltage detected by each of the voltage detecting ICs (21-1)-(21-5), so as to provide the voltage value after the subtraction, as the output voltage of the cells P1-P55. The details will be described later.

Figure 2:
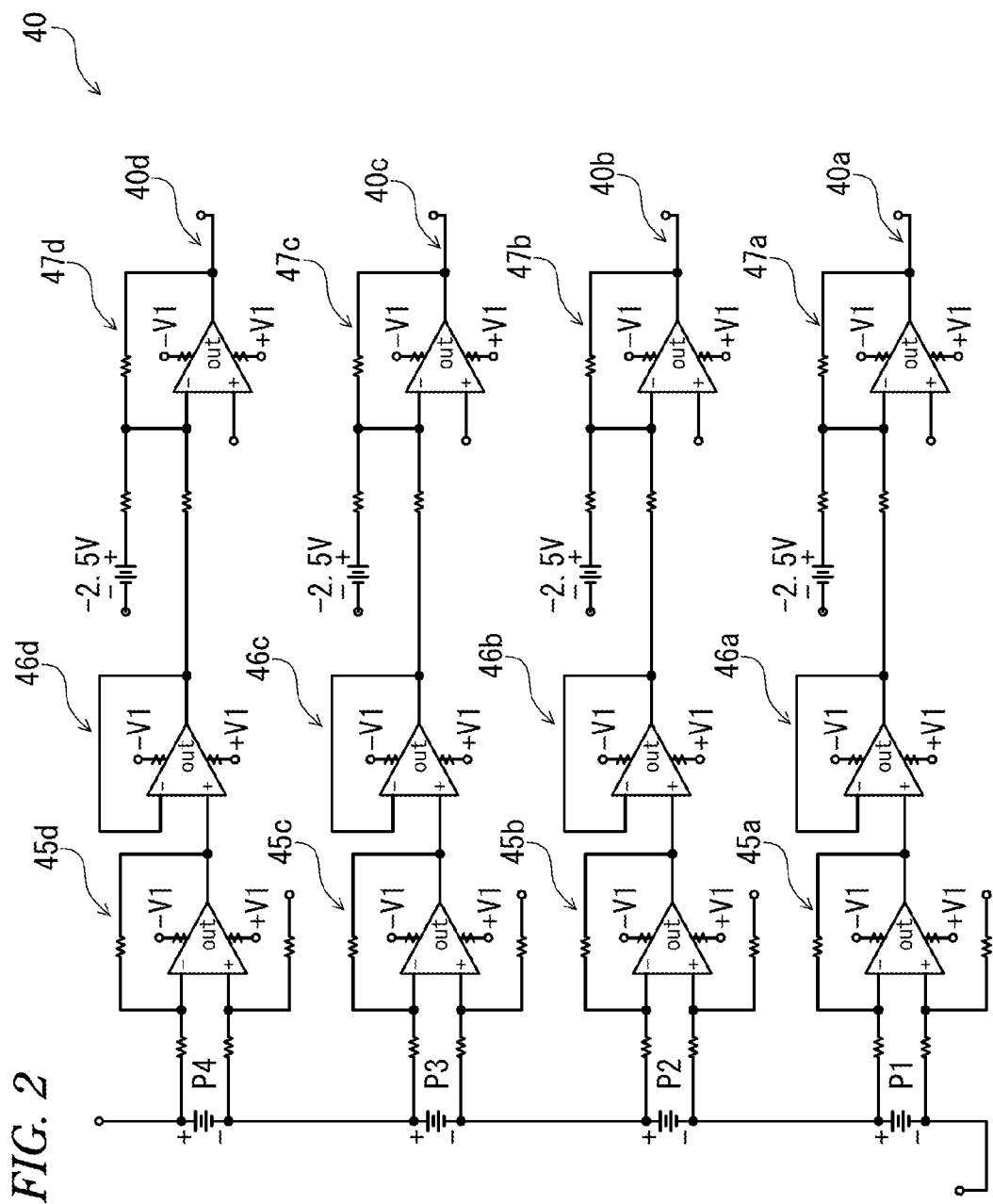
FIG. 2 is a block diagram showing the detailed configuration of the voltage measurement device according to the embodiment of the present invention.

Next, the voltage level shift circuit 40 according to the embodiment of the present invention will be described in detail with reference to FIG. 2. FIG. 2 is a circuit diagram of the voltage level shift circuit 40 which is disposed for the cells P1-P4. Incidentally, since the cells P5-P55 have the same circuit configuration as that of the cells P1-P4, they shall be omitted from detailed description.

As shown in FIG. 2, the cells P1-P4 are respectively provided with the voltage level shift circuits 40a-40d. The voltage level shift circuits 40a-40d include first inverting amplification circuits 45a-45d which amplify the voltages across the positive electrode terminals and negative electrode terminals of the cells P1-P4 and then output the amplified voltages, buffers 46a-46d which are disposed on the output sides of the first inverting amplification circuits 45a-45d, and second inverting amplification circuits 47a-47d which invert polarities by adding −2.5V to the output signals of the buffers 46a-46d (by amplifying 2.5 V).

The power sources +V1 and −V1 of operational amplifiers which the first inverting amplification circuits 45a-45d, the buffers 46a-46d and the second inverting amplification circuits 47a-47d include are supplied with powers from the DC/DC converter 42 (refer to FIG. 1). When the powers are supplied from the DC/DC converter 42, the voltage level shift circuits 40a-40d add 2.5V to the output voltages of the cells P1-P4 and then output the resulting voltages to the first voltage detecting IC (21-1) shown in FIG. 1.

In a case, for example, where the output voltage of the cell P1 is 2V being a positive voltage, the voltage level shift circuit 40 adds the voltage of 2.5V to the output voltage, and hence, the addition voltage which the voltage level shift circuit 40a outputs becomes 4.5V.

Besides, in a case, for example, where the output voltage of the cell P2 is −1.0V being a negative voltage, the voltage of 2.5V is added to the output voltage, and hence, the addition voltage which the voltage level shift circuit 40b outputs becomes 1.5V being a positive voltage.

Figure 3:
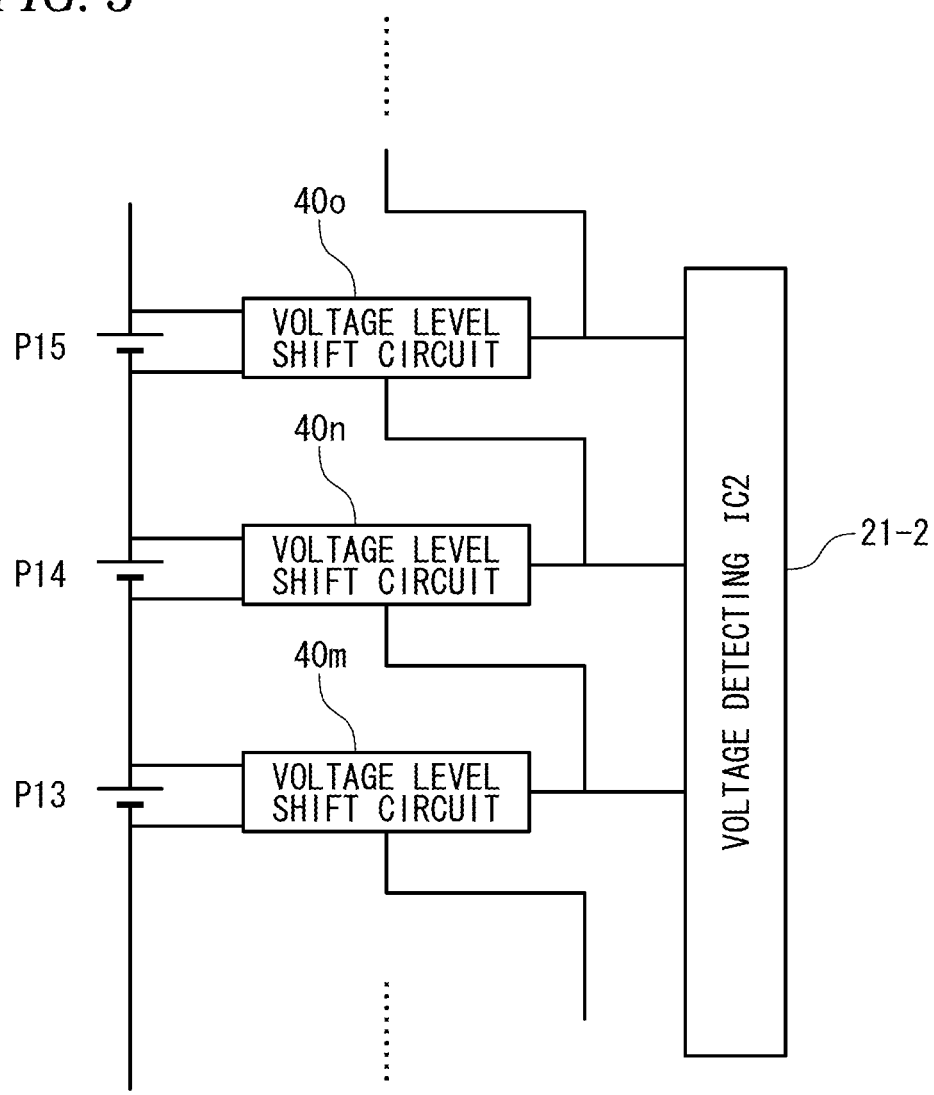
FIG. 3 is a diagram showing the voltage level shift circuits of the voltage measurement device according to the embodiment of the present invention.

Next, the reference voltage of the voltage level shift circuit 40 according to the embodiment of the present invention will be described with reference to FIG. 3. FIG. 3 is a diagram showing the reference voltage of the voltage level shift circuit 40 according to the embodiment of the present invention. Incidentally, since the cells P2-P55 have the same configuration as that of the cells P13-P15, they shall be omitted from detailed description.

As shown in FIG. 3, a voltage which is outputted from the voltage level shift circuit 40 of the nth cell (where 2≤n≤N holds) is measured with the voltage of the (n−1)th cell as a reference voltage. That is, the cell P14 (fourteenth cell) has its output voltage measured with the reference voltage being the voltage outputted from the voltage level shift circuit 40m of the cell P13 (thirteenth cell).

Besides, the cell P15 (fifteenth cell) has its output voltage measured with the reference voltage being the voltage outputted from the voltage level shift circuit 40n of the cell P14 (fourteenth cell). Incidentally, the cell P1 (first cell) (refer to FIG. 1) has its output voltage measured with the ground as the reference voltage.

Next, the detailed configuration of the voltage detecting IC according to the embodiment of the present invention will be described with reference to FIG. 4. FIG. 4 is a block diagram showing the internal configuration of the first voltage detecting IC (21-1). Incidentally, since the second-fifth voltage detecting ICs (21-2)-(21-5) have the same configuration as that of the first voltage detecting IC (21-1), they shall be omitted from detailed description.

Figure 4:
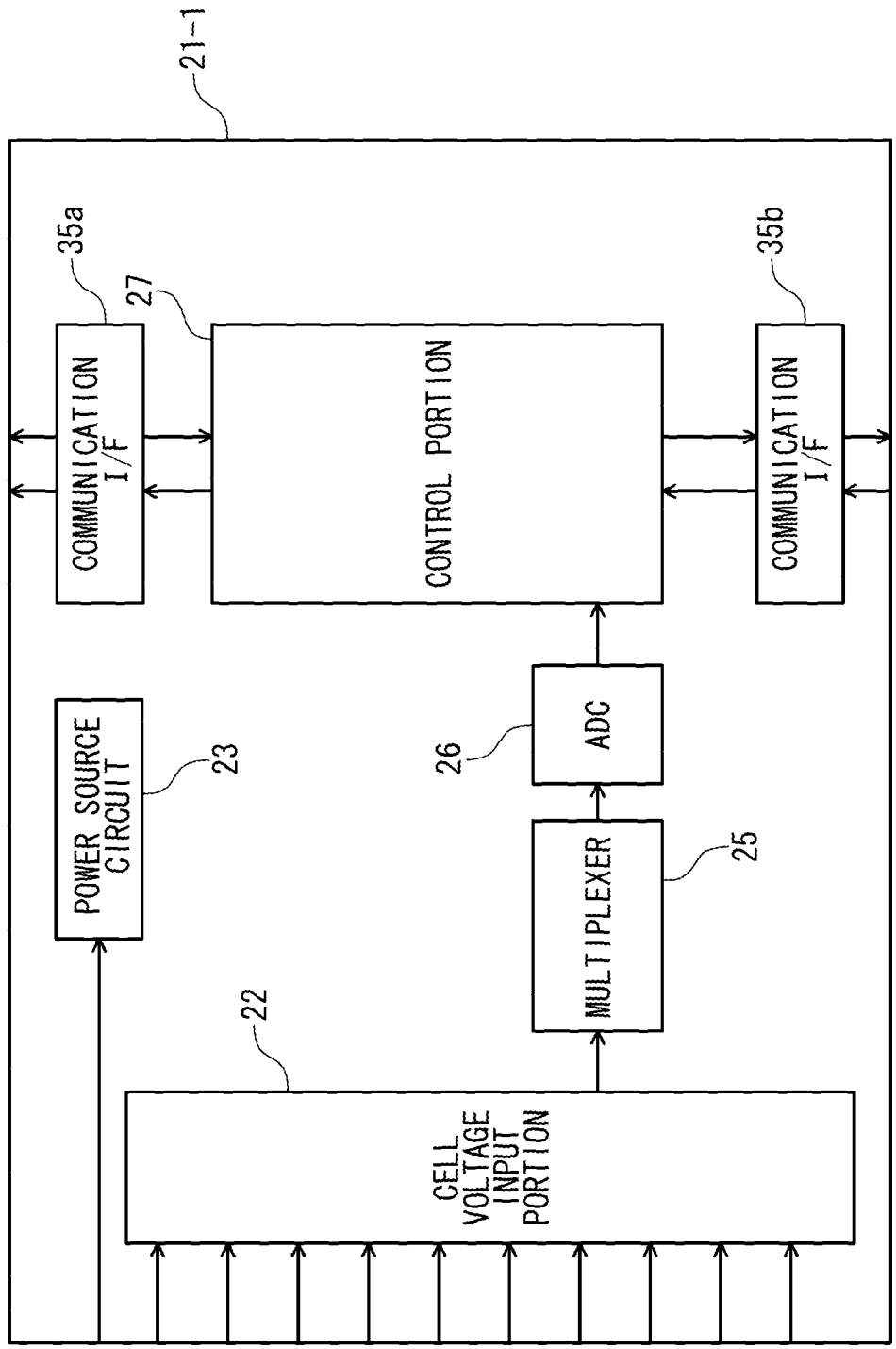
FIG. 4 is a diagram showing the reference voltage of the voltage level shift circuit of the voltage measurement device according to the embodiment of the present invention.

As shown in FIG. 4, the first voltage detecting I (C21-1) includes a power source circuit 23 to which powers outputted from the cells P1-P11 are inputted and which generates a predetermined voltage, a cell voltage input portion 22 which is connected with the voltage level shift circuits 40 provided for the individual cells P1-P11 disposed in the first block (61-1) and which detects the addition voltages being the output voltages of these voltage level shift circuits, a multiplexer 25 which converts the voltage signals of the individual cells outputted from the cell voltage input portion 22, into a time-serial signal of one series, and the A/D converter 26 which converts the voltage signal of each unit cell outputted from the multiplexer 25, into a digital signal.

The A/D converter 26 converts the addition voltage signal of each cell outputted from the multiplexer 25, into the digital signal by using the reference voltage outputted from the reference power source 71-1 (refer to FIG. 1). Besides, the first voltage detecting IC (21-1) includes a control portion 27, and two communication I/Fs 35a and 35b.

The control portion 27 generally controls the first voltage detecting IC (21-1). Especially in a case where the voltage measurement request signal for the cell voltage has been transmitted from the main microcomputer 33 shown in FIG. 1, the total voltage of the digital voltages, which are calculated in such a way that the output voltages of the voltage level shift circuits 40 disposed for the respective cells P1-P11 are digitized by the A/D converter 26, is obtained and is transmitted to the main microcomputer 33 via the communication I/F 35a or 35b.

Figure 5:
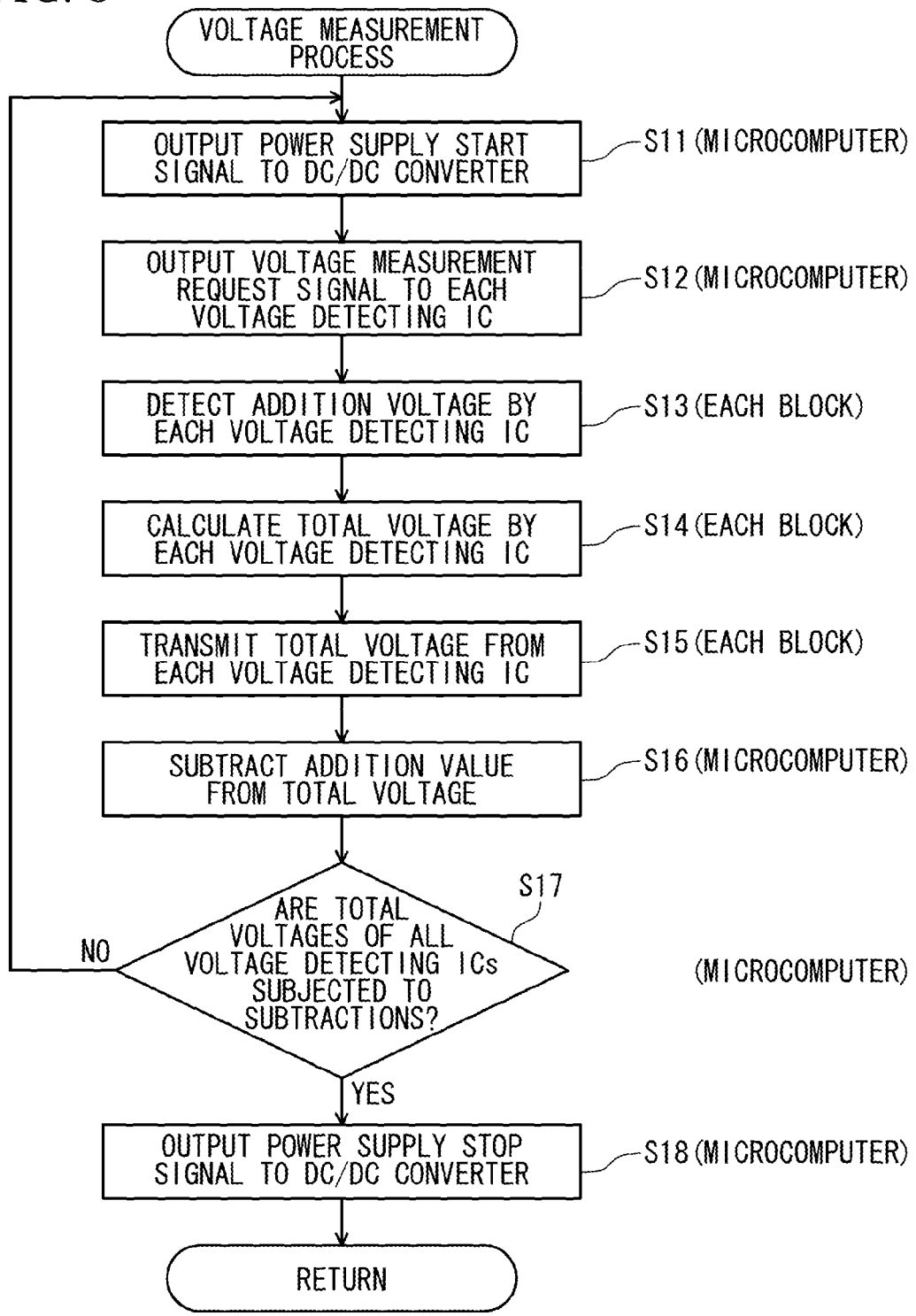
FIG. 5 is a flow chart showing the voltage measurement process of the voltage measurement device according to the embodiment of the present invention.

Next, there will be described the operation of the voltage measurement device 10 according to the embodiment of the present invention, configured as stated above. FIG. 5 is a flow chart of a voltage measurement process according to the embodiment of the present invention.

First, at the processing of a step S11, the main microcomputer 33 outputs a power supplying signal which commands the DC/DC converter 42 to start power supply. As a result, the output voltage (for example, 12V) of the battery 41 is boosted to a high voltage of about 40V, and it is supplied to the voltage level shift circuit 40.

At the processing of a step S12, the main microcomputer 33 outputs a voltage measurement request signal which commands the individual voltage detecting ICs (21-1)-(21-5) to measure the output voltages of the cells P1-P55 of each block, and to detect a total voltage obtained by totalizing addition voltages outputted from the voltage level shift circuit 40.

At the processing of a step S13, the individual voltage detecting ICs (21-1)-(21-5) given the commands by the main microcomputer 33 detect the addition voltages which are the output voltages of the voltage level shift circuits 40 corresponding to the cells P1-P55 of each block. At this processing, the addition voltages in which a predetermined voltage value (for example, 2.5V) is added to the output voltages of the individual cells P1-P55 by the voltage level shift circuits 40 are supplied to the cell voltage input portion 22. Further, the addition voltages are supplied to the A/D converter 26 through the multiplexer 25, so that digitized addition voltage data are inputted to the control portion 27.

At the processing of a step S14, the individual voltage detecting ICs (21-1)-(21-5) given the commands by the main microcomputer 33 calculate the total voltages of the addition voltage data inputted to the control portion 27. By way of example, the first voltage detecting IC (21-1) totalizes the eleven addition voltage values which are the output voltages of the cells P1-P11.

At the processing of a step S15, the voltage detecting ICs (21-1)-(21-5) given the commands by the main microcomputer 33 transmit the total voltage signals of the individual cells P1-P11 calculated by the control portion 27, to the main microcomputer 33 via the communication I/F 35a or 35b.

At the processing of a step S16, the main microcomputer 33 subtracts an addition value, which is obtained in such a way that the predetermined voltage value added by the voltage level shift circuit 40 is multiplied by the number of the cells (for example, eleven), from the total voltages transmitted from the voltage detecting ICs (21-1)-(21-5) given the commands.

At the processing of a step S17, it is decided whether or not the total voltages have been received from all of the individual voltage detecting ICs (21-1)-(21-5) so as to subtract the predetermined addition value from the total voltages. Subject to the decision (step S17: NO) that the total voltages have not been received from all of the individual voltage detecting ICs (21-1)-(21-5), and that the predetermined addition value has not been subtracted from the total voltages of all of the individual voltage detecting ICs (21-1)-(21-5), the main microcomputer 33 returns to the processing of the step S11, and it transmits the voltage measurement request signals by which the voltage detecting ICs (21-1)-(21-5) not having transmitted the total voltages are commanded to detect the total voltages.

On the other hand, subject to the decision (step S17: YES) that the total voltages have been received from all of the individual voltage detecting ICs (21-1)-(21-5), and that the predetermined addition value has been subtracted from the total voltages, the main microcomputer 33 outputs a power supply stop signal for commanding the DC/DC converter 42 to stop the power supply, at the processing of a step S18. The DC/DC converter 42 having acquired the power supply stop signal stops the supply of power to the voltage level shift circuit 40.

In addition, in a case where the voltage value obtained by subtracting the addition value does not lie within a predetermined range, the main microcomputer 33 judges the occurrence of any abnormality in the fuel battery, and it outputs an alarm signal. The alarm signal is transmitted to the host system (not shown) of the voltage measurement device 10, so as to report the occurrence of the abnormality to the occupant of the vehicle. When this processing has been ended, the voltage measurement process is ended.

In this manner, the voltage measurement device 10 according to the embodiment of the present invention includes voltage level shift circuits 40 which are respectively provided for a plurality of cells P1-P55, and which add a predetermined voltage value to the output voltages of the cells P1-P55, voltage detecting ICs (21-1)-(21-5) which are provided for respective blocks (61-1)-(61-5) that are obtained by sectioning the individual cells P1-P55 into the plurality of blocks (61-1)-(61-5) each being configured of at least one cell (for example, eleven cells), and which detect addition voltages that are the output voltages of the voltage level shift circuits 40 corresponding to the cells P1-P55 of the individual blocks (61-1)-(61-5), A/D converters 26 which are provided for the individual voltage detecting ICs (21-1)-(21-5), and which digitize the analog voltage signals of the addition voltages detected by the voltage detecting ICs (21-1)-(21-5), and a main microcomputer 33 which is connected through an insulation interface 32 among the individual voltage detecting ICs (21-1)-(21-5), which outputs voltage measurement request signals to the individual voltage detecting ICs (21-1)-(21-5) and acquires the addition voltages detected by the individual voltage detecting ICs (21-1)-(21-5), and which subtracts a predetermined voltage value from the acquired addition voltages and provides voltage values after the subtractions, as the output voltages of the cells P1-P55.

Besides, in the voltage measurement device 10 according to the embodiment of the present invention, the voltage detecting ICs (21-1)-(21-5) obtain the total voltages of the addition voltages which are outputted from the voltage level shift circuits 40 disposed for the individual blocks (61-1)-(61-5), and the main microcomputer 33 subtracts from the total voltages, values obtained in such a way that the predetermined voltage values are multiplied by the number (for example, eleven) of the cells disposed in each of the blocks (61-1)-(61-5).

Further, in the voltage measurement device 10 according to the embodiment of the present invention, a DC/DC converter 42 which is connected to a battery 41 that supplies power for actuating the main microcomputer and which converts power from the battery 41 is further included, the main microcomputer 33 outputs a power supplying signal for supplying the power to the DC/DC converter 42, in case of outputting the voltage measurement request signals to the individual voltage detecting ICs (21-1)-(21-5), and the DC/DC converter 42 supplies the powers to the voltage level shift circuits 40 when it has acquired the voltage measurement request signal from the main microcomputer 33.

Besides, in the voltage measurement device 10 according to the embodiment of the present invention, the N cells (fifty-five cells) of the first cell (P1) to the Nth cell (P55) are disposed as the cells P1-P55, the negative electrode of the first cell (P1) is grounded, the positive electrode of the Nth cell (P55) is set at the highest voltage, and the voltage of the nth cell (where $2 \leq n \leq N$ holds) is measured with the voltage of the (n−1)th cell as a reference voltage.

In addition, in accordance with the voltage measurement device 10 according to the embodiment of the present invention, a predetermined voltage value (for example, 2.5V) is added to the output voltages of the cells P1-P55, whereby an output voltage being a negative voltage (for example, −1.0V) is turned into an output voltage being a positive voltage (for example, 1.5V) and then outputted to the A/D converter, so that the output voltage being the negative voltage is not measured as "0" V.

Besides, the predetermined voltage value (for example, 2.5V) added is subtracted from the acquired addition voltage (for example, 1.5V), and the voltage value after the subtraction (for example, 0.5V) is provided as the output voltage of each of the cells P1-P55, so that the output voltage can be accurately measured.

It is accordingly permitted to provide a voltage measurement device for a battery assembly as is capable of accurately measuring an output voltage in which a positive voltage and a negative voltage coexist.

Besides, the value obtained in the way that the predetermined voltage value is multiplied by the number (for example, eleven) of the cells disposed in each block is subtracted from the total voltage of the addition voltages outputted by the voltage level shift circuits 40, so that the output voltages of the individual blocks can be accurately measured.

Further, since the predetermined voltage value is added by the voltage level shift circuits 40 corresponding to the cells P1-P55 of the individual blocks, the configurations of the voltage detecting ICs (21-1)-(21-5) need not be made different, and the output voltage in which the positive voltage and the negative voltage coexist can be measured with a manufacturing cost reduced.

Besides, the power is supplied to the voltage level shift circuit 40 by the DC/DC converter 42 which is connected to the battery 41 that supplies the power for actuating the main microcomputer 33, so that a power source need not be separately provided, and the manufacturing cost can be reduced.

Further, the voltage of the nth cell (for example, the fourteenth cell) is measured with the voltage of the (n−1)th cell (for example, the thirteenth cell) as a reference voltage, so that the cell voltage is infallibly measured with the reference voltage being the addition voltage which is the positive voltage, whereby the error of a measurement value can be lessened.

Thus far, the voltage measurement device for the fuel battery, according to the present invention, has been described in conjunction with the illustrated embodiment. However, the present invention is not restricted to this embodiment, but the configurations of various portions can be replaced with any desired configurations having similar functions.

By way of example, in the foregoing embodiment, there has been described the case of providing the single DC/DC converter 42 which supplies the powers to the voltage level shift circuits 40. However, the present invention is not restricted to this case, but DC/DC converters may well be disposed for the individual blocks.

Besides, in the foregoing embodiment, there has been described the case where the voltage level shift circuits 40 are supplied with the powers by the DC/DC converter 42. However, the present invention is not restricted to this case, but the voltage level shift circuits may well be configured so as to be supplied with powers outputted from the cells P1-P55, whereby a circuit configuration can be simplified.

Although the present invention has been described in detail and with reference to the specified embodiment, it is obvious to those skilled in the art that various alterations and revisions can be made without departing from the spirit and scope of the present invention.

The present invention is based on Japanese Patent Application (Patent Application 2010-103867) filed on Apr. 28, 2010, the contents of which are incorporated herein by reference.

INDUSTRIAL APPLICABILITY

The present invention is very useful in case of measuring that output voltage of a fuel battery in which a positive voltage and a negative voltage coexist.

DESCRIPTION OF REFERENCE NUMERALS

10 Voltage measurement device
11 High-voltage-side device
12 Low-voltage-side device
13 Fuel battery
21-1 to 21-5 First to fifth voltage detecting ICs
22 Cell voltage input portion
23 Power source circuit
25 Multiplexer
26 A/D converter
27 Control portion
28 Communication portion
31 Communication line
32 Insulation interface
33 Main microcomputer
35 Communication I/F
40 Voltage level shift circuit
41 Battery
42 DC/DC converter
43 Regulator
45 First inverting amplification circuit
46 Buffer
47 Second inverting amplification circuit
61-1 to 61-5 First to fifth blocks
71-1 to 71-5 Reference power sources

The invention claimed is:

1. A voltage measurement device for measuring an output voltage of a battery assembly in which a plurality of cells are connected in series so as to output a desired voltage, the voltage measurement device comprising:

voltage addition sections that are respectively provided for the plurality of cells, and that add a predetermined voltage value to output voltages of the cells;

voltage detection sections that are provided for respective blocks, and that detect addition voltages which are output voltages of the voltage addition sections corresponding to the cells of the individual blocks wherein the cells are sectioned into the blocks each being constituted by at least one cell;

A/D converting sections that are provided for the individual voltage detection sections, and that digitize analog voltage signals of the addition voltages detected by the voltage detection sections; and a control section that is connected through communication lines among the voltage detection sections respectively and outputs voltage measurement request signals to the voltage detection sections respectively, and that acquires the addition voltages detected by the voltage detection sections respectively, subtracts the predetermined voltage value from the acquired addition voltages, and provides voltage values after the subtractions, as the output voltages of the cells, wherein the voltage addition sections include first inverting amplification circuits which amplify the voltages across the positive electrode terminals and negative electrode terminals of the cells and then output the amplified voltages, buffers which are disposed on the output sides of the first inverting amplification circuits, and second inverting amplification circuits which invert polarities by adding the predetermined voltage value to the output signals of the buffers, wherein the voltage addition sections add the predetermined voltage value to the output voltages by adding negative voltage which is the predetermined voltage value to the output voltage which is inverted by the first inverting amplification circuits and by inputting the inverted and added voltages into the second inverting amplification circuits and inverting the inverted and added voltages again.

2. The voltage measurement device according to claim 1, wherein each of the voltage detection sections obtains a total voltage of the addition voltages outputted from the voltage addition sections provided for each of the blocks; and wherein the control section subtracts from the total voltage, a value obtained by multiplying the predetermined voltage value by the number of the cells disposed in each of the blocks.

3. The voltage measurement device according to claim 1, further comprising:

a voltage converting section that is connected to a power source which supplies power for actuating the control section and that converts the power from the power source, wherein the control section outputs a power supplying signal for supplying power to the voltage converting section in case of outputting the voltage measurement request signals to the voltage detection sections respectively; and wherein the voltage converting section supplies power to the voltage addition sections when the voltage converting section acquires the voltage measurement request signal from the control section.

4. The voltage measurement device according to claim 1, wherein the N cells of the first cell to the Nth cell are disposed as the cells;

wherein a negative electrode of the first cell is grounded;

wherein a positive electrode of the Nth cell is set at the highest voltage; and wherein a voltage of the nth cell (where $2 \leq n \leq N$) is measured based on a voltage of the (n−1)th cell as a reference voltage.

* * * * *